United States Patent

Okimura

[11] Patent Number: 5,946,256
[45] Date of Patent: Aug. 31, 1999

[54] SEMICONDUCTOR MEMORY HAVING DATA TRANSFER BETWEEN RAM ARRAY AND SAM ARRAY

[75] Inventor: Yasunori Okimura, Kanagawa, Japan

[73] Assignee: NEC Corporation, Tokyo, Japan

[21] Appl. No.: 08/920,907

[22] Filed: Aug. 29, 1997

[30] Foreign Application Priority Data

Aug. 29, 1996 [JP] Japan .................................. 8-228735

[51] Int. Cl.$^6$ .................................................. G11C 7/00
[52] U.S. Cl. ...................................... 365/221; 365/230.01
[58] Field of Search .............................. 365/221, 230.03, 365/230.01, 230.05, 230.09

[56] References Cited

U.S. PATENT DOCUMENTS 5,699,314  12/1997  Hush et al. .............................. 365/221

FOREIGN PATENT DOCUMENTS 4-341994  11/1992  Japan .

*Primary Examiner*—David Nelms
*Assistant Examiner*—David Lam
*Attorney, Agent, or Firm*—Young & Thompson

[57] ABSTRACT

In order to shorten the processing time for partially rewrite the data of a SAM array with data of a RAM array without rewriting the content held in the RAM array, and to elevate the integration density, a read transfer gate 11 is added with a mask control function, and there is also added a function of fetching a read mask data SMDr into a serial mask register 13 and of supplying the read mask data SMDr to the read transfer gate 11. The mask data is fetched from an external to the serial mask register 13 through a random data input/output port Prdt, and the control for fetching the mask data is executed on the basis of a serial data latch timing signal SMLT generated in a timing generator 14 on the basis of a row address strobe signal. Thus, the partial data rewriting of the data in the SAM array 8 can be executed in one data transfer cycle.

3 Claims, 5 Drawing Sheets

SEMICONDUCTOR MEMORY HAVING DATA TRANSFER BETWEEN RAM ARRAY AND SAM ARRAY

BACKGROUND OF THE INVENTION

1. Field of the invention

The present invention relates to a semiconductor memory, and more specifically to a semiconductor memory used as a VRAM in an image processing.

2. Description of related art

A semiconductor memory used as a VRAM in an image processing ordinarily comprises a function of inputting/outputting a random access data and a function of inputting/outputting a serial data. A typical example of this semiconductor memory is shown in FIG. 4.

This semiconductor memory first includes, as external input/output ports, a RAM timing control signal input port Prtc, an address input port Pad, a random data input/output port Prdt, a SAM timing control signal input port Pstc, a serial data input/output port Psdt, a serial mask data input port Psmd. An internal construction includes a RAM array which is a multi-bit memory cell array composed of memory cells arranged in a two-dimensional array having rows and columns, a row address buffer circuit 2 and a row address decoder 3 for obtaining a row address indicating a position of a row in the RAM array 1, a column address buffer circuit 4 and a column address decoder 5 for obtaining a column address indicating a position of a column in the RAM array 1, a SAM array 8 composed of linearly-arranged memory cells of the same number as the number of memory cells in a column direction, a serial address counter 10 operating to sequentially count up or down in synchronism with a serial clock SC supplied through the SAM timing control signal port Psc in order to sequentially read/write the memory cells of the SAM array 8 in accordance with a column address of the RAM array 1, a serial address decoder 9 for decoding the value of the serial address counter 10 to internally generate an address of the SAM array 8, a mask register 7 for holding data indicating the position of a bit(s) to be masked when the RAM array 1 is to be written through the external input/output port, a read/write controller 6 for controlling the writing into the RAM array 1 in accordance with the position of the bit(s) to be masked from the writing, indicated by the data of the mask register 7, a serial mask register 13$x$ for holding data indicating the position of a bit(s) to be masked when a write transfer from the SAM array 8 to the RAM array 1 is carried out, a write transfer gate 12 for controlling the write transfer from the SAM array 8 to the RAM array 1 in accordance with the position of the bit(s) to masked from the write transfer, indicated by the serial mask register 13$x$, a read transfer gate 11$x$ for controlling the data transfer from the RAM array 1 to the SAM array 8, and a timing generator 14$x$ for controlling operation timings of the RAM array 1 and the SAM array 8.

As regards the above mentioned semiconductor memory, first, a method for carrying a random read/write operation to the RAM array 1 will be described.

In order to carry out the reading/writing to a memory cell at an arbitrary position in the RAM array 1, a row address and a column address are supplied simultaneously. The row address is supplied through the address input port Pad from an external, and then, is latched in the row address buffer circuit 2 in response to a row address latch timing signal RLT generated in the timing generator 14$x$ on the basis of a RAS (row address strobe) signal supplied through the RAM timing control signal input port Prtc. The row address latched in the row address buffer circuit 2 is decoded by the row address decoder 3 and then is supplied to the RAM array 1.

On the other hand, the column address is also supplied through the address input port Pad from the external, and then, is latched in the column address buffer circuit 4 in response to a column address latch timing signal CLT generated in the timing generator 14$x$ on the basis of a CAS (column address strobe) signal supplied through the RAM timing control signal input port Prtc. The column address latched in the column address buffer circuit 4 is decoded by the column address decoder 5 and then is supplied to the RAM array 1. Thereafter, the read/write operation is executed to the memory cell within the RAM array 1 designated by the decoded values of the row address decoder 3 and the column address decoder 5, through the random data input/output port Prdt.

This semiconductor memory also has a write inhibit function for carrying a write masking in units of a bit, using the data of the mask register 7, when the writing is carried out to the RAM array 1.

Next, a serial read method for reading the data from the RAM array 1 through the SAM array 8 will be described.

When the serial reading is carried out, first, the data of the RAM array 1 is transferred to the SAM array 8. This transfer is executed for the data on the row address designated by the row address buffer circuit 2 and the row address decoder 3 associated to the RAM array 1. Therefore, this transfer is executed in a cycle requiring the same time as that of the random read/write cycle. The data transferred to the SAM array 8 is sequentially read out through the serial data input/output port Psdt in synchronism with the serial clock signal SC supplied from the SAM timing control signal input port Pstc, asynchronously with the RAM timing control signal. This data reading of this SAM array 1 can ordinarily be executed in the cycle, which is about ⅙ of the read/write cycle of the RAM array 1, by not multiplexing the address, and by constructing the memory in a SRAM structure so that when the memory cell of the SAM array is read out, a sense operations required at the time of reading the memory cell of the RAM array 1 is no longer necessary.

Furthermore, a serial write method for writing the data into the RAM array 1 through the SAM array 8 will be described.

In a serial writing operation, data to be written is first sequentially written into the SAM array 8 through the serial data/input port Psdt in synchronism with the serial clock signal SC supplied through the SAM control signal port Pstc. The data written in the SAM array 8 is then transferred to the RAM array 1 so as to be written into memory cells within the RAM array 1. At this time, by supplying information (SMD) of a bit(s) or column(s) not to be masked, from the serial mask input port Psmd to the serial mask register 13$x$, the transfer to the memory cells at a special bit(s) or a column address(es) within the RAM array 1 can be masked.

Referring to FIG. 5, there is shown a circuit diagram of a specific circuit example of a data transfer system of this semiconductor memory. In FIG. 5, SDB designates a serial data bus, and SRWC indicates a serial read/write control signal. SMEP and SMEN denote a SAM activation enable signal, and SMDw shows mask data controlled by the write transfer control signal. RTC designates a lump read transfer control signal, and RRWC indicates a random read/write control signal. RDB denotes a random data bus, and SEP and SEN show a sense amplifier enable signal. WL designates a word line.

By supplying the information of the bit(s) or column(s) to be masked, from the serial mask input port Psmd to the serial mask register 13x, the transfer to the memory cell(s) on a special bit(s) or column address(es) within the RAM array 1 is masked. As a means for controlling this masking, a write transfer control signal WTC is provided for each bit or column to be masked.

In an image processing using this semiconductor memory, in order to partially rewrite the data of the SAM array 8 with the data of the RAM array 1, for example by allocating data including R(red), G(green), B(blue) and brightness to respective bits and by rewriting the data of R, G and B by the data of the RAM while fixing only the data of the brightness, it is necessary that the information of the column not to be rewritten by the data of the RAM is written into the serial mask register 13x, and thereafter, data is transferred once from the SAM array 8 to the RAM array 8 at the row address to be used for the partial rewriting, while using the serial mask function based on the information of the serial mask register 13x, and then, the data on the memory cells on the same row address in the RAM array 1 is re-transferred to the SAM array 8. Alternatively, it is necessary to write the data to be left in the SAM array 8, to the RAM array 1 at the row address to be used for the partial writing, in a random writing mode, and then, to transfer the data on the memory cells on the same row address in the RAM array 1 to the SAM array 8.

As mentioned above, in this prior art semiconductor memory, in order to partially rewrite the data of the SAM array 8 with the data of the RAM array 1, it is necessary to carry out either of the following two methods: In the first method, after the information of the column not to be rewritten with the data of the RAM array 1 is written into the serial mask register 13x, data is transferred once from the SAM array 8 to the RAM array 8 at the row address to be used for the partial rewriting, while using the serial mask function based on the information of the serial mask register 13x, and then, the data on the memory cells on the same row address in the RAM array 1 is re-transferred so the SAM array 8. The second method is to write the data to be left in the SAM array 8, to the RAM array 1 at the row address to be used for the partial writing, in a random writing mode, and then, to transfer the data on the memory cells on the same row address in the RAM array 1 to the SAM array 8. Therefore, the processing time becomes large, and it becomes one cause for remarkably lowering a high speed processing capability inherently required for the VRAM. In particular, in the VRAM having no serial write function, only the second method can be adopted, so that the larger the number of data to be held in the SAM array is, the processing capability abruptly drops. In either case, it is a problem that the content held in the RAM array 1 is rewritten.

Furthermore, since the serial mask register 13x is written in the serial write operation, the RAM timing control signal input port Prtc operating asynchronously cannot be used, and therefore, it is necessary to provide the serial mask data input port Psmd as an interface to the external. As a result, the chip area is increased by provision of the port, and therefore, the integration density drops. This is a problem.

SUMMARY OF THE INVENTION

Accordingly, it is an object of the present invention to provide a semiconductor memory which has overcome the above mentioned problems of the prior art.

Another object of the present invention is to provide a semiconductor memory capable of shortening the processing time for partially rewriting data of a SAM array with data of a RAM array without rewriting the content held in the RAM array, and also capable of increasing the integration density.

The semiconductor memory in accordance with the present invention comprises a RAM array composed of memory cells arranged in a two-dimensional array having rows and columns and allowing a writing/reading of data to be executed for a designated address, a SAM array composed of linearly-arranged memory cells of the same number as that of memory cells included in one row within the RAM array and configured to allow a serial writing/reading of data to be executed for these memory cells, a write transfer gate for transferring data from the SAM array to the RAM array while executing a mask-control on the basis of a writing mask data, a read transfer gate for transferring data from the RAM array to the SAM array while executing a mask-control on the basis of a reading mask data, and a serial mask register for holding the writing mask data and the reading mask data.

Furthermore, the semiconductor memory includes a random data input/output port for inputting/outputting data in a random access to the RAM array, and is so configured that the writing mask data and the reading mask data is fetched through the random data input/output port at a predetermined timing in a data transfer cycle for transferring data between the RAM array and the SAM array. The predetermined timing in the data transfer cycle is determined by a serial mask data latch timing signal generated in synchronism with a row address strobe signal.

DESCRIPTION OF THE PREFERRED EMBODIMENTS

Now, an embodiment of the semiconductor memory in accordance with the present invention will be described with reference to the accompanying drawings.

Figure 1:
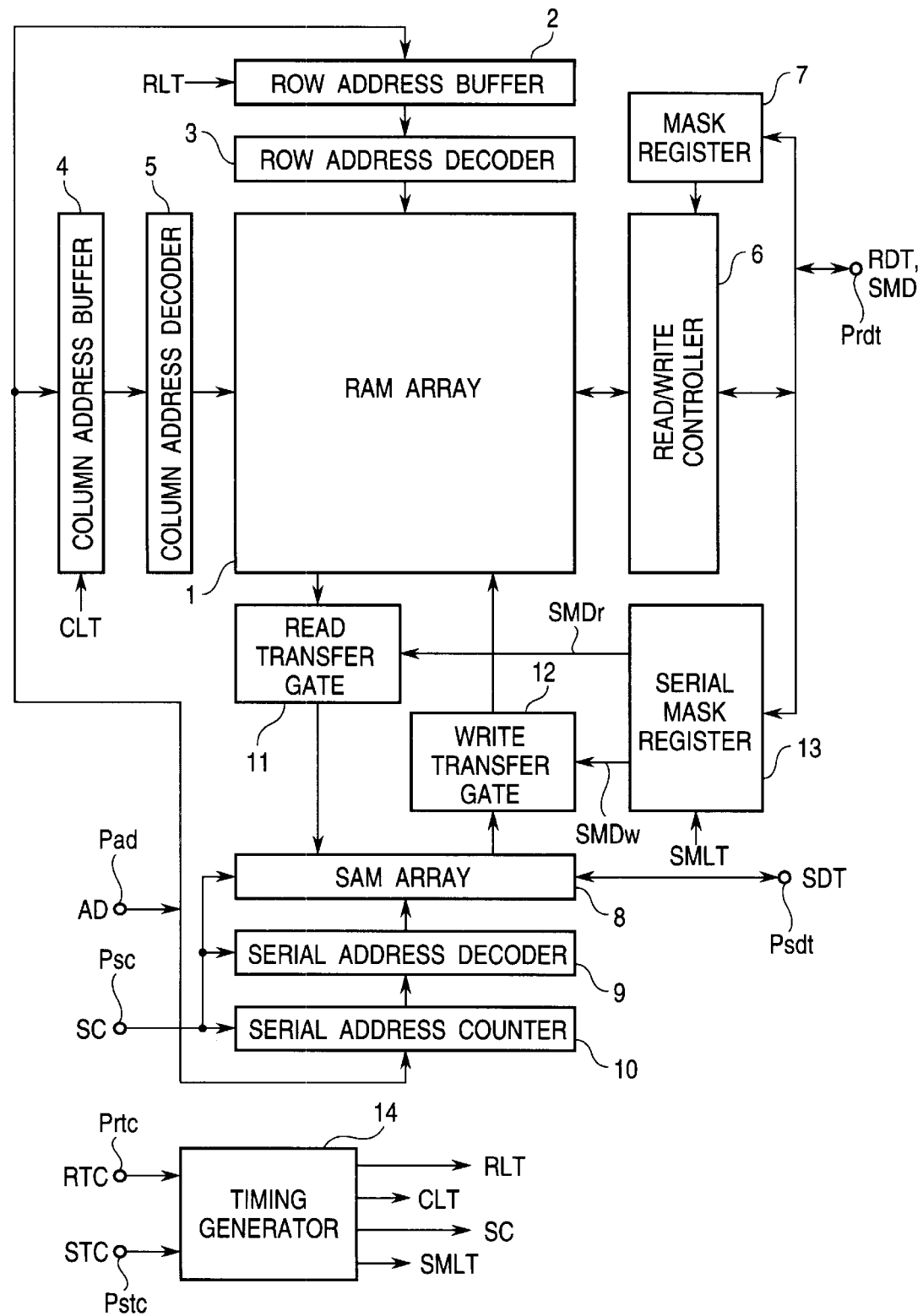
FIG. 1 is a block diagram of an embodiment of the semiconductor memory in accordance with the present invention.

FIG. 1 is a block diagram of an embodiment of the semiconductor memory in accordance with the present invention.

Figure 4:
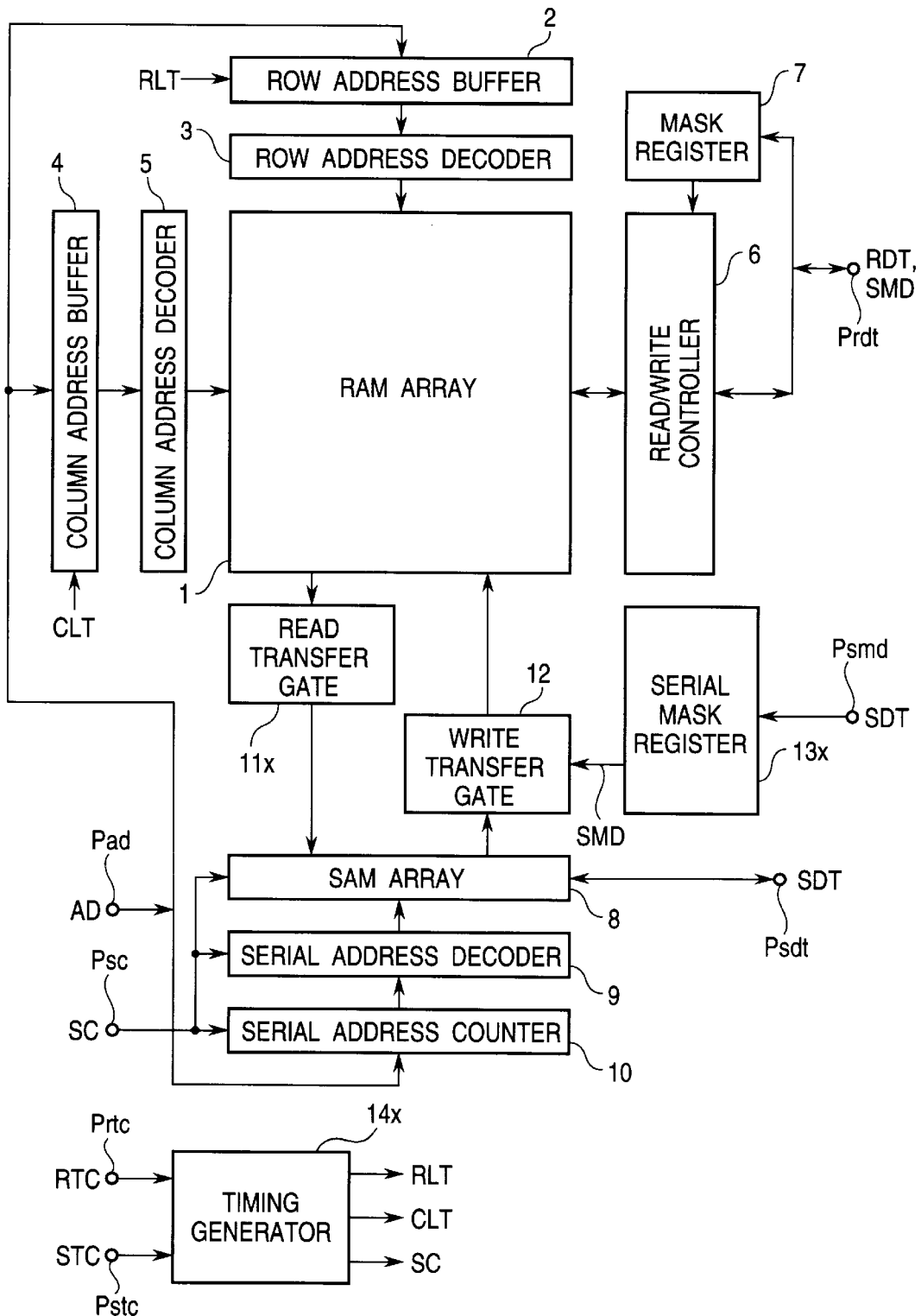
FIG. 4 is block diagram of an example of the prior art semiconductor memory.

This embodiment is different from the prior art semiconductor memory shown in FIG. 4 (called simply a "prior art"hereinafter) in that the read transfer gate 11x of the prior art is modified to a read transfer gate 11 added with a mask function of transferring data from the RAM array 1 to the SAM array 8 while carrying a mask control in accordance with a reading mask data; in that the serial mask register 13x is replaced with a serial mask register 13 for latching and holding a reading mask data SMDr and a writing mask data SMDw, in response to a serial mask data latch timing signal SMLT, the serial mask register 13 outputting the reading mask data SMDr to the read transfer gate 11, the serial mask register 13 outputting the writing mask data SMDW to the write transfer gate 12; in that the fetching and the transfer of the reading/writing mask data SMD to the serial mask register 13 from an external is carried out through the random data input/output port Prdt; and in that the timing generator 14x is modified to a timing generator 14 obtained by changing a serial mask data latch timing signal generating function of the timing generator 14x (this serial mask data latch timing signal is omitted in the prior art shown FIG. 4) to a function of generating a serial mask data latch timing signal SMLT by using the RAS (row address strobe) signal (in synchronism with the RAS signal).

Figure 2:
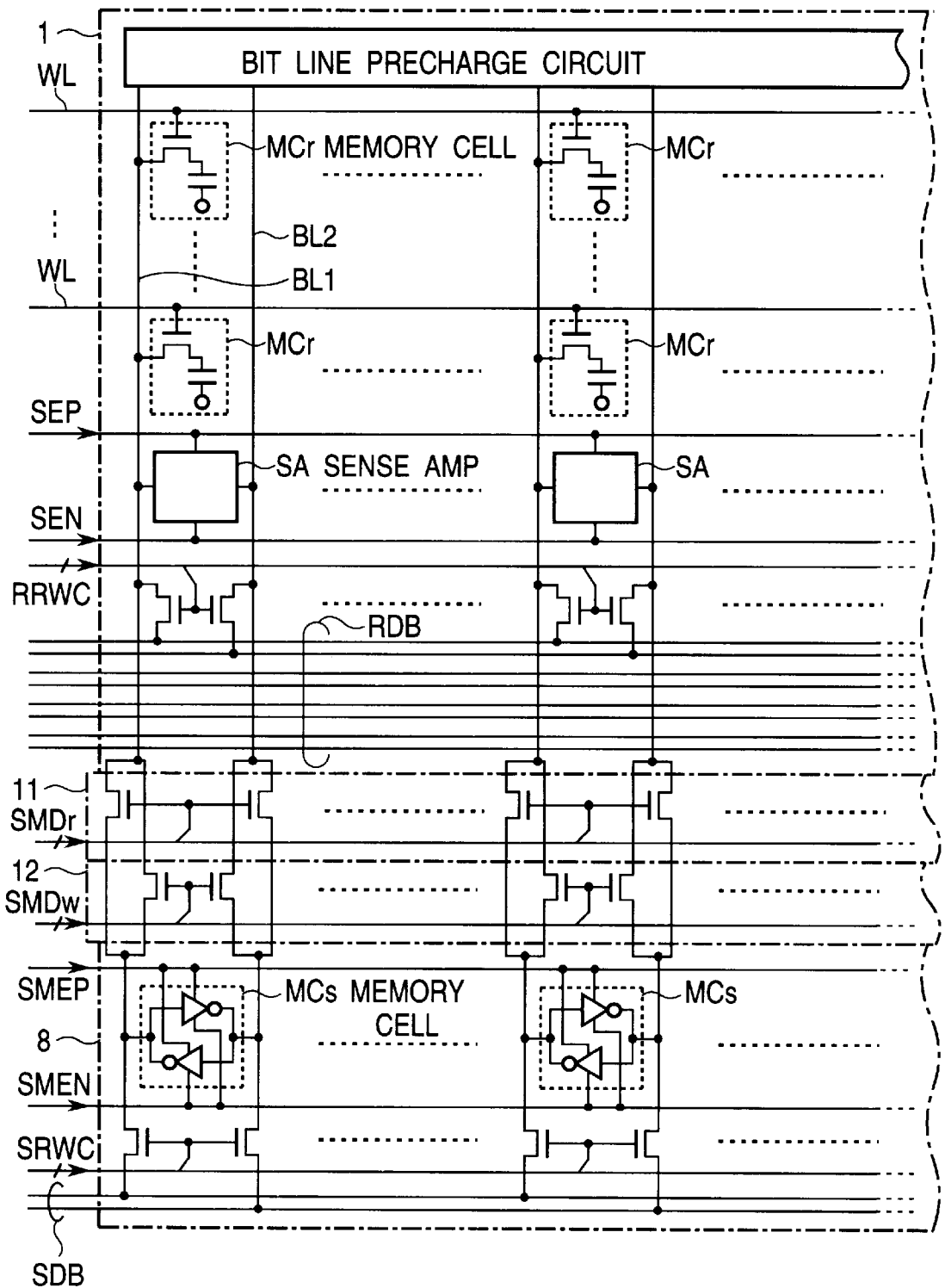
FIG. 2 is a circuit diagram showing a detailed circuit example of the data transfer system in the embodiment shown in FIG. 1.

FIG. 2 is a circuit diagram showing a detailed circuit example of the data transfer system in this embodiment.

Figure 5:
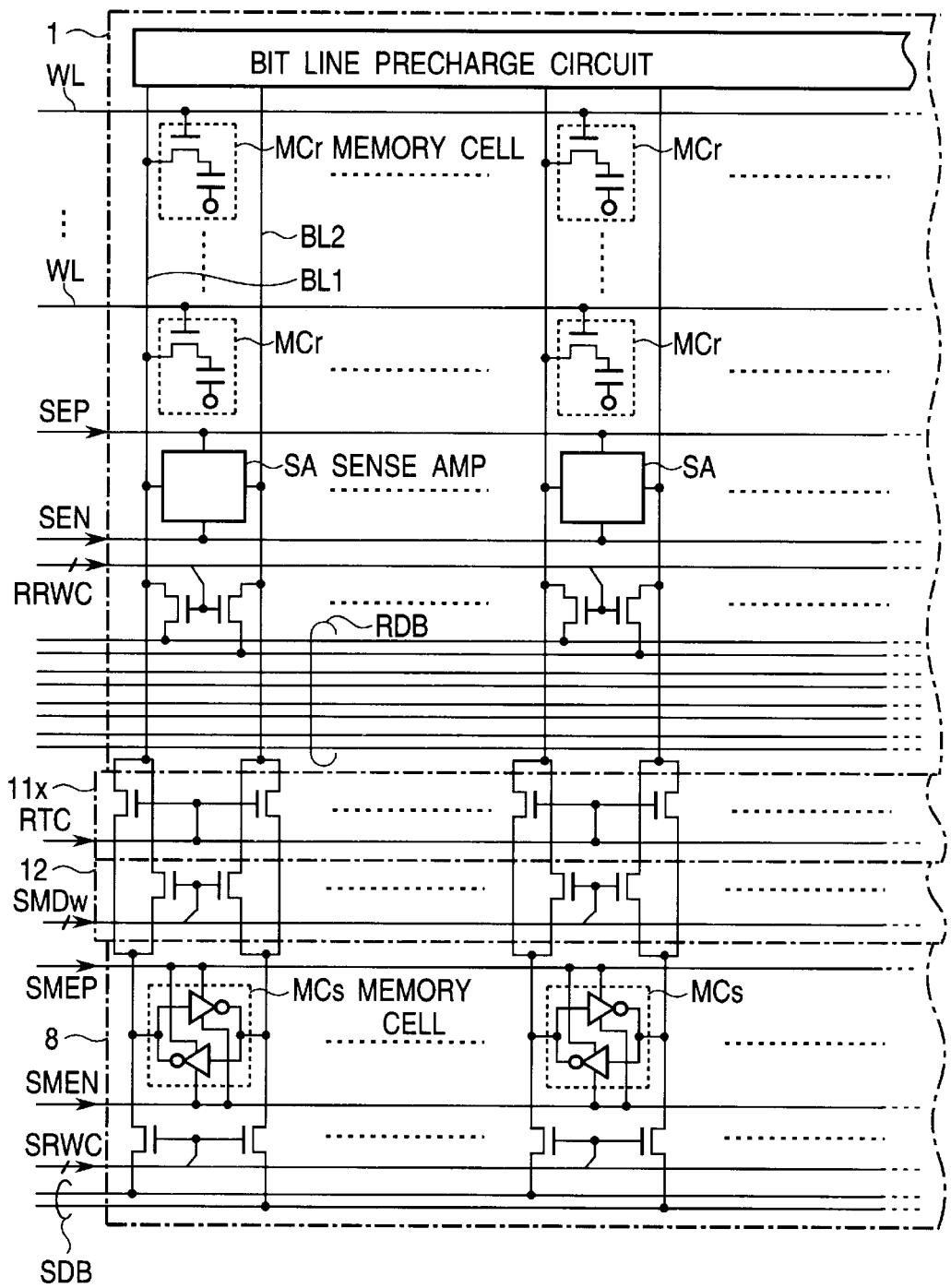
FIG. 5 is a circuit diagram showing a detailed circuit example of the data transfer system in the semiconductor memory shown in FIG. 4.

This circuit is different from the prior art shown in FIG. 5 in that the read transfer gates 11x of the prior art are controlled by the one lump read transfer control signal RTC, but the read transfer gates 11 of the present invention are controlled by a plurality of reading mask data SMDr, respectively, which is controlled by the read transfer control signal.

Now, an operation of this embodiment will be described. Since the random read/write operation is the same as that of the prior art, explanation thereof will be omitted, and therefore, the serial read/write operation will be described.

When the serial read operation for reading the data of the RAM array 1 through the SAM array 8, first, the data of the RAM array 1 is transferred to the SAM array 8. Similarly to the prior art, this data transfer is executed for the data at the row address designated by the row address buffer 2 and the row address decoder 3 associated to the RAM array 1. Here, that which differs from the prior art is that, at a predetermined timing in a data transfer cycle, the reading mask data SMDr for the transfer masking is internally fetched through the random data input/output port Prdt, and latched in the serial mask register 13 by the serial mask data latch timing signal SMLT generated in the timing generator 14 using the RAS (row address strobe) signal, and in that, at the data transfer in the reading operation, the bit masking or column masking is controlled in accordance with the reading mask data SMDr from the serial mask register 13. Thereafter, the data transferred in the SAM array 8 is sequentially read out through the serial data input/output port Psdt in synchronism with the serial clock signal SC generated in the timing generator 14 on the basis of the SAM timings control signal STC, asynchronously with the RAM timing control signal RTC, similarly to the prior art example.

In this embodiment, the reading mask data SMDr controlled by the read transfer control signal for controlling the read transfer gate 11 is provided in units of a bit or column so that a plurality of reading mask data SMDr are provided. Therefore, it is possible to independently control respective transfer gates in accordance with the reading mask data from the serial mask register 13, so that the masking is controlled in the data transfer from the RAM array 1 to the SAM array 8.

Next, the serial write operation will be described. In the serial write operation, similarly to the prior art, data to be written is first sequentially written into the SAM array 8 through the serial data input/output port Psdt in synchronism with the serial clock signal SC generated in the timing generator 14 on the basis of the SAM timing control signal STC. Thereafter, the data written in the SAM array 8 is transferred to the RAM array 1 under the mask control based on the writing mask data SMDw, so that it is written into memory cells in the RAM array 1. But, this embodiment is different from the prior art in that the writing mask data SMDw used for executing the masking in the data transfer from the SAM array 8 to the RAM array 1 is fetched into the serial mask register 13 at a predetermined timing in a data transfer cycle for transferring the data from the SAM array 8 to the RAM array 1.

As mentioned above, since the read transfer gate 11 has the mask control function, this embodiment can partially rewrite the data of the SAM array 8 with the data of the RAM array 1 in one data transfer cycle, so that the processing time can be greatly shortened. At this time, the data held in the RAM array 1 is never rewritten. In addition, since the fetching of the mask data into the serial mask register 13 is executed through the random data input/output port Prdt which is not used in the data transfer cycle, it is possible to omit the serial mask data input port Psmd in the prior art, and therefore, the integration density can be correspondingly elevated.

Figure 3:
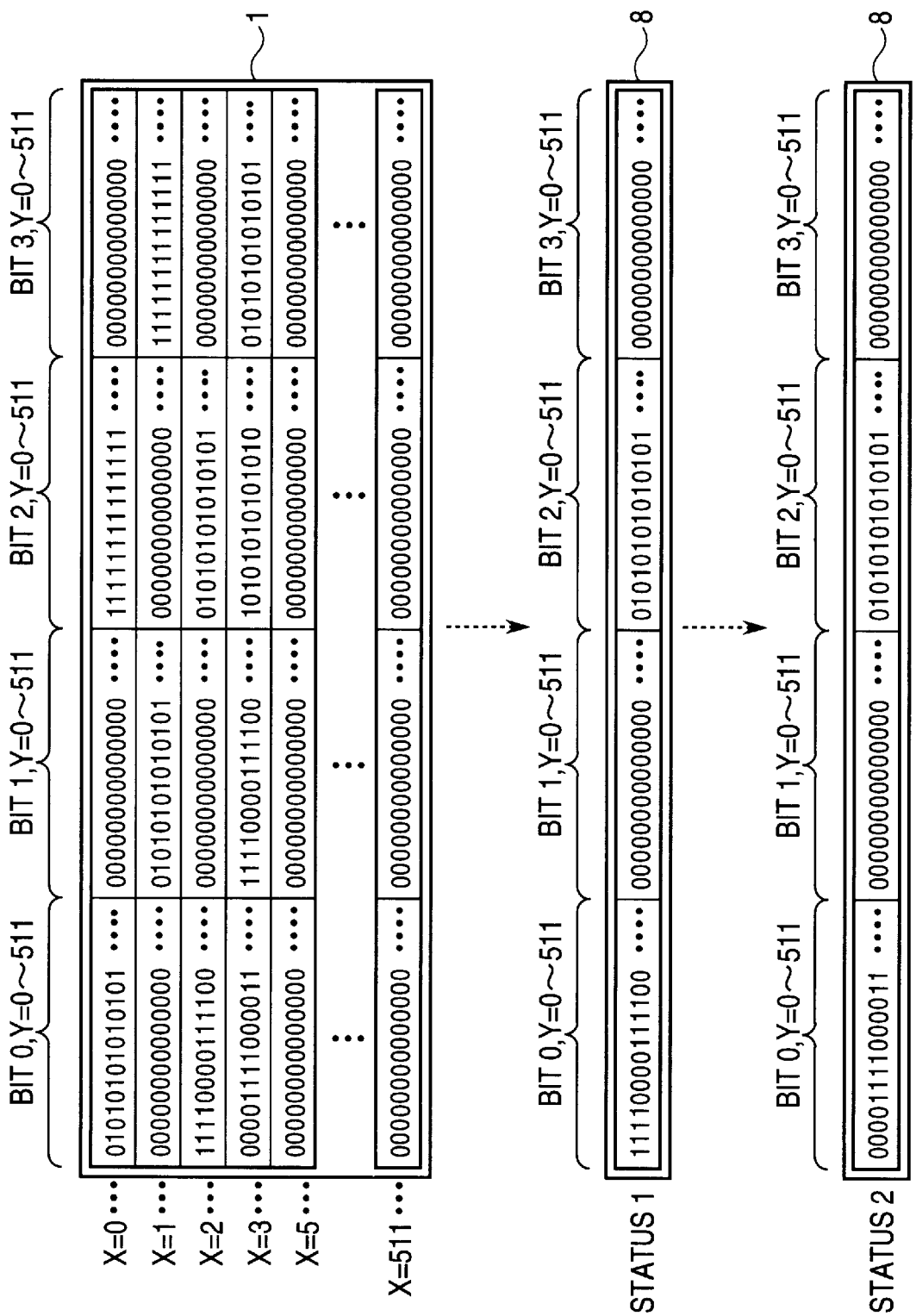
FIG. 3 is a data memory location diagram for illustrating the processing time for partially rewriting the data of the SAM array with the date of the RAM data in the embodiment shown in FIG. 1.

Next, the above mentioned processing time will be described with reference to FIG. 3, assuming that, as shown, data is held in the RAM array 1 of 512 (X address=row address)×512 (Y address=column address)×4 bits, and data as shown in "STATUS 1" is previously held in the SAM array 8 of 512 addresses×4 bits, and the content of the SAM array 8 is to be changed to "STATUS 2".

In the prior art (FIG. 4) of the VRAM having the serial write function, when data having the same content as that of the "STATUS 2" does not exist in the RAM array 1, the fastest processing is to write the data of the content of the "STATUS 2" through the serial data input/output port Psdt to memory cells of Y=0 to 511 of all the bits of the SAM array 8. In this case, the time of 512 serial cycles is required as a whole. Alternatively, in the prior art VRAM having no serial data write function, it is necessary to write the content of the "STATUS 2" to Y=0 to 511 into a certain X address within the RAM array 1 in the random access manner, and then to transfer the data at the same X address in the RAM array 1 to the SAM array 8. Therefore, the time of 513 random write cycles is required as a whole.

Here, assuming that the time required for the data transfer cycle and the time required for the random write cycle is six times the serial clock SC (six times the serial clock cycle), the progressing time of the present invention becomes about 1/85 of the prior art, and about 1/513 of the VRAM having no serial write function.

As mentioned above, according to the present invention, since the read transfer gate is added with the mask control function, the processing for partially rewriting the data of the SAM array with the data of the RAM array can be executed in one data transfer cycle, without rewriting the data held in the RAM array. Therefore, the processing time can be advantageously shortened.

In addition, since the serial mask data is fetched through the random data input/output port, the serial mask data input port required in the prior art, is no longer necessary, and therefore, the integration density can be correspondingly elevated.

I claim:

1. A semiconductor memory comprising a RAM array composed of memory cells arranged in a two-dimensional array having rows and columns and allowing a writing/reading of data to be executed for a designated address, a SAM array composed of linearly-arranged memory cells of the same number as that of memory cells included in one row within the RAM array and configured to allow a serial writing/reading of data to be executed for these memory cells, a write transfer gate for transferring data from the SAM array to the RAM array while executing a mask-control on the basis of a writing mask data, a read transfer gate for transferring data from the RAM array to the SAM array while executing a mask-control on the basis of a reading mask data, and a serial mask register for holding the writing mask data and the reading mask data.

2. A semiconductor memory claimed in claim 1 further including a random data input/output port for inputting/outputting data in a random access to the RAM array, and wherein the writing mask data and the reading mask data is fetched through the random data input/output port at a predetermined timing in a data transfer cycle for transferring data between the RAM array and the SAM array.

3. A semiconductor memory claimed in claim 2 wherein the predetermined timing in the data transfer cycle is determined by a serial mask data latch timing signal generated in synchronism with a row address strobe signal.

* * * * *